(12) United States Patent
Haba et al.

(10) Patent No.: US 7,304,376 B2
(45) Date of Patent: Dec. 4, 2007

(54) MICROELECTRONIC ASSEMBLIES WITH SPRINGS

(75) Inventors: Belgacem Haba, Cupertino, CA (US); Jae M. Park, San Jose, CA (US); Teck-Gyu Kang, San Jose, CA (US); Nicholas J. Colella, Pleasanton, CA (US)

(73) Assignee: Tessers, Inc., San Jose, CA (US)

( * ) Notice: Subject to any disclaimer, the term of this patent is extended or adjusted under 35 U.S.C. 154(b) by 288 days.

(21) Appl. No.: 10/901,407

(22) Filed: Jul. 28, 2004

(65) Prior Publication Data

US 2005/0040540 A1    Feb. 24, 2005

Related U.S. Application Data

(60) Provisional application No. 60/491,212, filed on Jul. 30, 2003.

(51) Int. Cl.
*H01L 23/48* (2006.01)

(52) U.S. Cl. ............................. 257/696; 257/722

(58) Field of Classification Search ................ 257/678, 257/696, 692, 722, 698
See application file for complete search history.

(56) References Cited

U.S. PATENT DOCUMENTS

| 5,794,330 | A  | * | 8/1998  | Distefano et al. ............. 29/840 |
| 5,917,707 | A  | * | 6/1999  | Khandros et al. ........... 361/776 |
| 6,778,406 | B2 | * | 8/2004  | Eldridge et al. ............. 361/776 |
| 6,965,245 | B2 | * | 11/2005 | Kister et al. ................ 324/755 |

* cited by examiner

*Primary Examiner*—Roy Potter
(74) *Attorney, Agent, or Firm*—Lerner, David, Littenberg, Krumholz & Mentlik, LLP (57) ABSTRACT

A microelectronic element such as a semiconductor chip has springs such as coil springs bonded to contacts so that the springs serve as electrical connections to a circuit panel. The unit can be tested readily and can be surface-mounted to a circuit panel by bonding the distal ends of the springs, remote from the microelectronic element, to the panel. The springs can also serve as antennas so as to provide a miniaturized phased array.

30 Claims, 7 Drawing Sheets

MICROELECTRONIC ASSEMBLIES WITH SPRINGS

CROSS REFERENCE TO RELATED APPLICATIONS

This application claims the benefit of the filing date of United States Provisional Patent Application No. 60/491,212 filed Jul. 30, 2003, the disclosure of which is hereby incorporated herein by reference.

BACKGROUND OF THE INVENTION

The present invention relates to microelectronic assemblies incorporating springs and to methods and elements used in such assemblies.

Microelectronic elements such as packaged and unpackaged semiconductor chips, multi-chip modules and the like are normally mounted on circuit panels such as circuit boards by bonding terminals of the microelectronic element to contact pads on a circuit board using a bonding material such as solder. Assemblies of this type can fail due to breakage of the bonding material. For example, in a so-called "flip-chip" mounting, an unpackaged, "bare" semiconductor chip is mounted with the contact-bearing front face of the chip confronting the top surface of the circuit board and with contacts of the chip bonded directly to contact pads on the circuit board by masses of solder referred to as solder balls. In the bonding process, the solder balls are melted to form the bond and then solidified by cooling the assembly. As the assembly cools from the solidification temperature of the solder to room temperature, both the chip and the circuit board tend to contract, but the circuit board typically contracts to a greater extent than the chip, because the circuit board typically has a greater coefficient of thermal expansion than the chip. Differential contraction during cooling places mechanical stresses on the solder balls. In service, as the assembly is operated, the components are repeatedly heated and cooled, imposing additional, repeated mechanical stresses on the solder balls. The mechanical stresses applied during manufacture and service can cause the solder balls to break and lead to failure of the assembly. Similar problems arise in mounting other microelectronic elements.

Moreover, it is highly desirable to test microelectronic elements before mounting them to circuit panels, so as to assure that only good elements are included in the larger assemblies on the panels. To test a microelectronic element, reliable temporary connections must be established between the mounting terminals of the microelectronic element and the contacts of a test fixture. Considerable difficulty can be encountered in establishing reliable connections with all of the numerous terminals on a microelectronic element at the same time. For example, where a microelectronic element includes a rigid, theoretically planar array of terminals intended for solder bonding to a circuit panel, some of the terminals may be slightly out of plane. This makes it difficult to establish simultaneous contact with all of the terminals using a rigid test fixture. In some cases, solder balls are mounted to the terminals of the microelectronic element during manufacture. This further complicates the testing problem, because solder can accumulate on the contacts of the test fixture when numerous microelectronic elements are tested in sequence.

Considerable efforts have been devoted heretofore to alleviating these problems. For example, microelectronic elements can be provided in packages having terminals separate from the contacts of the chip or the microelectronic element itself. Certain packaged microelectronic elements sold under the trademark µBGA® by Tessera, Inc. and its licensees have terminals which are movable relative to the chip or the microelectronic element itself. Such movability can alleviate stresses on the solder balls caused by differential thermal expansion and contraction. Moreover, in some cases, movability of the terminals can facilitate engagement of terminals with a test fixture. Most commonly, the terminals are mounted on a dielectric element as, for example, a polymeric sheet or panel and are connected to the contacts of the microelectronic element itself by leads within the package. In certain preferred embodiments, the packaged microelectronic element itself may be approximately the same size as a comparable unpackaged microelectronic element and, accordingly, may occupy little or no additional space on the circuit panel. The techniques used in µBGA® packaged microelectronic elements have been successfully used and widely adopted in the industry. However, despite these improvements, still further improvements and alternatives would be desirable.

Test fixtures having resilient movable contacts have been employed to test packaged and unpackaged microelectronic elements. While some of these test fixtures permit reliable engagement between the terminals of a microelectronic element and the test fixture, such test fixtures can add to the cost of the testing operation. Moreover, improvements in test fixtures do not alleviate the problem of bond failure or the problem of solder accumulation on the test fixture.

Yet another approach which has been adopted is to alter the bond between the microelectronic element and the circuit panel in ways which make the bond more resistant to applied stresses. For example, as taught in Grabbe, U.S. Pat. No. 4,642,889, solder masses interconnecting an electronic element and a circuit panel may include fine reinforcing wires such as copper wires. Allen et al., U.S. Pat. No. 4,705,205 discloses a similar approach in which the solder element may include a metallic strand or strip which, in certain embodiments, is illustrated as a helical element surrounding the solder mass. While addition of reinforcements may increase the reliability of the solder bond, it does not solve the testing problem. Brofman et al., U.S. Pat. No. 5,968,670 employs solder-coated springs in conjunction with ordinary solder masses. During the bonding operation, while the solder masses connecting the terminals of the microelectronic element and the circuit board are in a molten condition, the solder on the springs melts and allows the springs to expand. The expanding springs force the microelectronic element away from the circuit board, thereby stretching the molten solder masses into elongated columns. The solder masses retain the columnar shape when cooled. The elongated, columnar solder masses are more resistant to stresses applied during service. This approach also does not address the testing problem. Solder-coated springs are also used as internal elements of printed circuit boards, as taught, for example, in Dube et al., U.S. Pat. No. 3,509,270 and Beck, U.S. Pat. No. 3,616,532. These arrangements do not address the problems of mounting a microelectronic element to a circuit panel. Other references which discuss springs or wire-like elements as mounting elements include Kanji et al., U.S. Pat. No. 5,067,007; Calomagno et al., U.S. Pat. No. 4,955,523; and Khandros et al. U.S. Pat. No. 6,442,831.

SUMMARY OF THE INVENTION

One aspect of the invention provides a microelectronic device incorporating a microelectronic element having a front surface and terminals exposed at the front surface and a plurality of springs, each having a proximal end and a distal end. The device most preferably includes and a bonding material securing the proximal ends of the springs to terminals, the distal ends of the springs projecting away from the microelectronic element and terminals. The distal ends of the springs preferably are devoid of the bonding material which secures the proximal ends of the springs to the terminals. The springs preferably are coil springs defining a passage extending at least part of the way between their proximal ends and their distal ends, and the passages of at least some of the springs are at least partially unfilled by the bonding material. A wide variety of microelectronic elements may be incorporated in the device. In a particularly useful variant, the microelectronic element is an unpackaged semiconductor chip. Devices according to this aspect of the present invention can be tested readily using a simple test substrate, and can be mounted readily to a circuit panel or other substrate, as, for example, by the use of conventional surface mounting techniques.

A further aspect of the invention provides methods of making microelectronic assemblies. Methods according to this aspect of the invention desirably include the step of bonding a plurality of springs to a plurality of terminals on a microelectronic element using a first bonding material so that the first bonding material secures proximal ends of the springs to said contacts and so that distal ends of said springs project away from said contacts. Where the springs are coil springs or other springs defining internal passages, the bonding step most preferably is performed so that the first bonding material does not entirely fill the passages of the springs. Most preferably, the bonding step is performed so that distal ends of the springs remain devoid of the bonding material. The microelectronic element may be a chip or a wafer incorporating a plurality of such chips, which is then severed to form individual units such as single chips. The method according to this aspect of the invention desirably further includes the step of engaging the distal ends of the springs with contacts on a test substrate and testing the microelectronic element by operating the element using signals or power transmitted through the engaged springs and contacts. The microelectronic element may then be disengaged from the test substrate and engaged with contacts of a second substrate. The distal ends of the springs may be bonded to the contacts of the second substrate using a second bonding material such as a solder.

Yet another aspect of the invention provides a miniaturized phased array device. A device according to this aspect of the invention includes a chip or other element having terminals and a plurality of coil springs mounted to the terminals. The chip or other element desirably includes a transmitting or receiving circuit and plural signal paths adapted to convey signals, desirably at about 10 GHz or above, such paths having known or adjustable phase delays. The coil springs serve as individual radiating elements of a phased array.

DETAILED DESCRIPTION

A device according to one embodiment of the invention includes a microelectronic element 20 having a front face 22 and a plurality of first contacts 24 exposed at the front face. In the embodiment depicted in FIG. 1, microelectronic element 20 is an unpackaged or "bare" chip. Such a chip typically includes one or more internal layers (not shown) defining active or passive electrical devices, as well as a passivation layer 26 typically formed from a dielectric material defining those portions of front surface 22 surrounding contacts 24. Contacts 24 serve as the mounting terminals of element 20. Although contacts 24 are depicted as flush with the surrounding portions of front surface 22, this is not necessary; the contacts 24 may project slightly from the surrounding portions of the front surface or may be recessed below the front surface, provided that the contacts remain accessible at the front surface. In the embodiments illustrated, contacts 24 are distributed in an array such that adjacent contacts are spaced apart from one another by an intercontact spacing distance $D_f$. This distance, as measured from the center of one contact to the center of the next adjacent contact, may be uniform or non-uniform throughout the array. Merely by way of example, such distance may be less than about 1 mm and typically less than about 500 microns. The array may cover the entirety of front surface 22 or a portion thereof. Merely by way of example, the array may consist of rows of contacts disposed along adjacent edges of the chip bordering the front surface, or may consist of a uniform grid of contacts covering the entire front surface, or may consist of one or more rows extending across a central portion of the front surface, remote from the edges. Essentially any arrangement of contacts can be employed.

Figure 14:
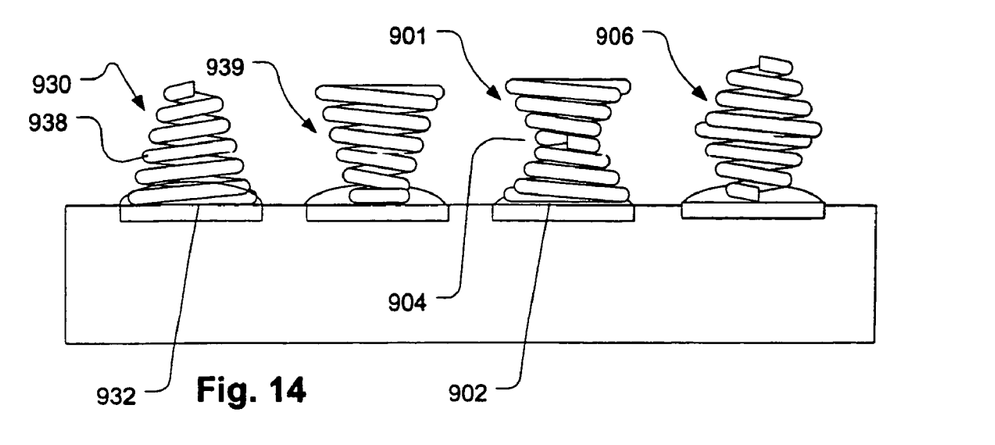
FIG. 14 is a view similar to FIG. 1 depicting a device according to yet another embodiment of the invention.

The device further includes a plurality of springs 30. Each spring 30 is mounted to one of the contacts 24. Each spring 30 in this embodiment is a coil spring. Each spring has a proximal end 32 mounted to the associated contact, a distal end 34 remote from the associated contact and an axis 36 extending between the proximal and distal ends. Each spring incorporates one or more wires formed into a plurality of substantially helical turns 38 encircling the axis 36 of the spring. The turns 38 define a central bore or passage 42 (FIG. 2) inside the turns and surrounding the central axis 36 of the spring. The wire preferably is an electrically conductive metallic wire, most preferably including copper or a copper alloy. Desirably, the springs include a coating such as a nickel/gold coating to enhance solderability. In the embodiment depicted, all of the turns are formed from a single wire and are of substantially uniform diameter, so that the spring as a whole is generally cylindrical. Other configurations, in which the diameter of the turns varies along the length of the spring, in the directions along axis 36, can be employed. One example of such other configurations is a tapered coil spring 930 depicted in FIG. 14, having turns 938 which decrease progressively in diameter in the axial direction from the proximal end 932 to the distal end 934, so that the spring is generally in the form of a frustum of a cone. Another example is a tapered, generally frustoconical coil spring 939, also shown in FIG. 14, in which the coils increase progressively in diameter in the proximal-to-distal direction. Yet another example is an hourglass-shaped spring 901, in which the coils decrease progressively in diameter from the proximal end 902 to a minimum-diameter point 904, and increase in diameter from the minimum-diameter point to the distal end of the spring. The opposite configuration, commonly referred to as a barrel-type spring 906, in which the coils increase progressively in diameter from the ends of the spring to a maximum-diameter point, also can be employed. Additionally, in any of the coil springs discussed above, the pitch of the turns can vary along the axial length of the coil spring. Further, although a single device can include various types and lengths of coil springs as depicted in FIG. 14, it is preferred to use springs of substantially uniform configuration within a single device.

Figures 1, 2:
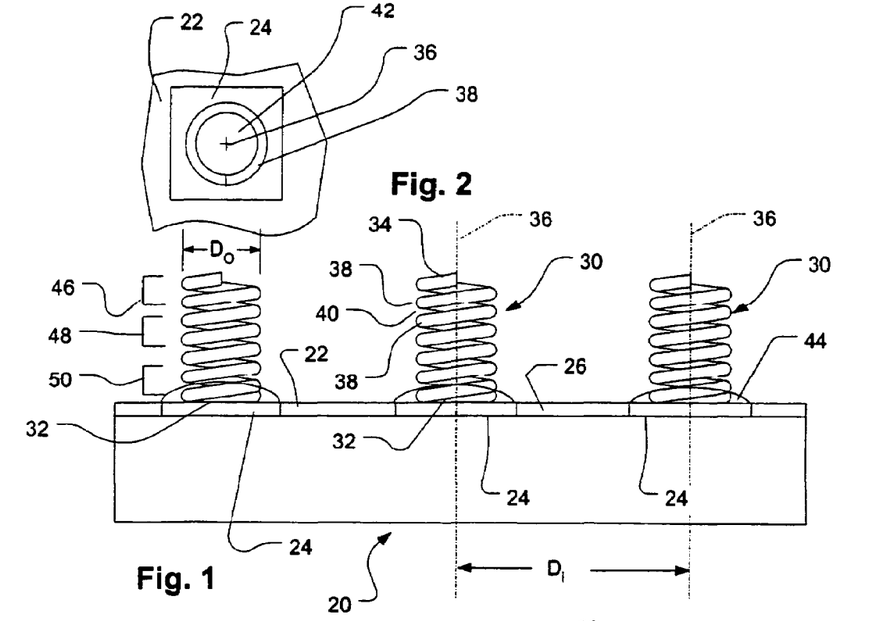
FIG. 1 is a fragmentary, diagrammatic sectional view of a device in accordance with one embodiment of the invention.
FIG. 2 is a fragmentary, diagrammatic top plan view of the device shown in FIG. 1.

In the free or undeformed condition of the springs depicted in FIG. 1, there are gaps 40 between adjacent turns 38 of each spring. The gaps 40 form a substantially helical channel or passage extending from the proximal end of the spring to the distal end of the spring.

Each spring 30 desirably has an outside diameter $D_o$ of about 500 microns or less, desirably about 300 microns or less and most preferably about 100-200 microns, although smaller or larger sizes can be employed. Each spring typically is less than about 2 mm long, more typically less than about 1 mm long, and desirably less than about 500 μm long.

The proximal end 32 of each spring is secured to the associated terminal or contact 24 of microelectronic element 20 by a mass of a first bonding material 44. Bonding material 44 desirably covers at least a part and preferably all of one or more turns of each spring adjacent the proximal end 32, so that each spring is mechanically embedded within the bonding material. However, bonding material 44 most preferably does not substantially fill that portion of the central bore 42 (FIG. 2) in a distal region 46 adjacent the distal end 34 of each spring, or in a central region 48 adjacent the middle of the axial length of the spring. Stated another way, the bonding material desirably is confined to the proximal region 50 of the spring, adjacent the proximal end 32 of the spring. Likewise, the bonding material desirably does not fill the gaps 40 between turns of the spring in the central region 48 or in the distal region 46. Thus, at least in the central and distal regions, each spring remains substantially free to deflect and deform in the normal manner and has spring properties substantially unaffected by the bonding material.

Bonding material 44 desirably is a solder or other metallic bonding material capable of forming a metallurgical bond with the metal of the springs and the metal of the contact pads 24. The bonding material may be applied as a so-called solder paste, i.e., a dispersion of solder in an organic binder, or as a substantially pure solder. Desirably, the proximal ends of the springs are embedded in the solder or solder paste while the same is in a substantially flowable condition, i.e., before removal of the organic carrier in the case of a solder paste, or while the solder is in a molten state. The shape of the solder mass as shown in FIG. 1 is an idealized representation; the actual shape of each solder mass typically is formed by flow during the bonding procedure and, hence, has a shape determined by surface tension effects.

Springs 30 project from contacts 24 so that the axis 36 of each spring is substantially normal to the front surface 22 of element 20, and so that the distal end 34 projects away from the associated contact and projects away from the front surface 22 of the element. Most preferably, the central axis 36 of each spring is substantially aligned with the center of the associated contact 24, although some deviation from perfect alignment is acceptable. In the free or undeformed state of springs 30, the distal ends 34 of all of the springs desirably lie substantially in a common plane with one another, such plane being an imaginary plane parallel to the front surface 22 of the microelectronic element. Desirably, the distal ends of the springs are within about 100 microns of exactly coplanar and more desirably within about 50 microns of perfect coplanarity.

The microelectronic element as described above with reference to FIGS. 1 and 2 can be handled, shipped and stocked in the same manner as a packaged microelectronic element. In one stage of a process according to a further embodiment of the invention, the microelectronic element 20, with springs 30, is engaged with a first substrate 52, also referred to as a test substrate. Test substrate 52 has a first set of contacts 54, also referred to herein as test contacts, exposed at a front face 56. The test contacts 54 are arranged in a pattern corresponding to the pattern of the contacts 24 on the microelectronic element. Test substrate 52 may be a substantially flat, rigid element such as a ceramic panel, thick reinforced polymer board or other relatively rigid circuit panel. Test contacts 54 are rigidly mounted to the substrate and may be substantially planar structures. Here again, although the test contacts are depicted as flush with the front surface 56 of the test substrate, this is not essential; the test contacts may project from surface 56 or may be recessed slightly beneath the surface, provided that the test contacts are exposed at surface 56 and, hence, are accessible for engagement with elements presented at surface 56. The test contacts are connected via internal wiring (not shown) within or on the test substrate to appropriate test circuitry (not shown) for operating a microelectronic element engaged with the test substrate. Thus, the microelectronic element 20 is positioned so that the front face 22 of the microelectronic element faces toward the front face 56 of the test substrate, and so that the contacts 24 of the microelectronic element are substantially aligned with the test contacts 52 of the test substrate. As springs 30 are aligned with contacts 24, such placement also aligns springs 30 with the test contacts 54. The microelectronic element and test substrate are urged toward one another, as indicated by arrows 58 in FIG. 3. The force used to urge these elements toward one another may be applied by essentially any available force-applying device as, for example, by a pair of platens 60 overlying the rear surfaces of the microelectronic element and test substrate. The platens may be moved by conventional gravitational, pneumatic, electrical or mechanical devices, so as to force the microelectronic element 20 and test substrate 52 toward one another.

Figure 3:
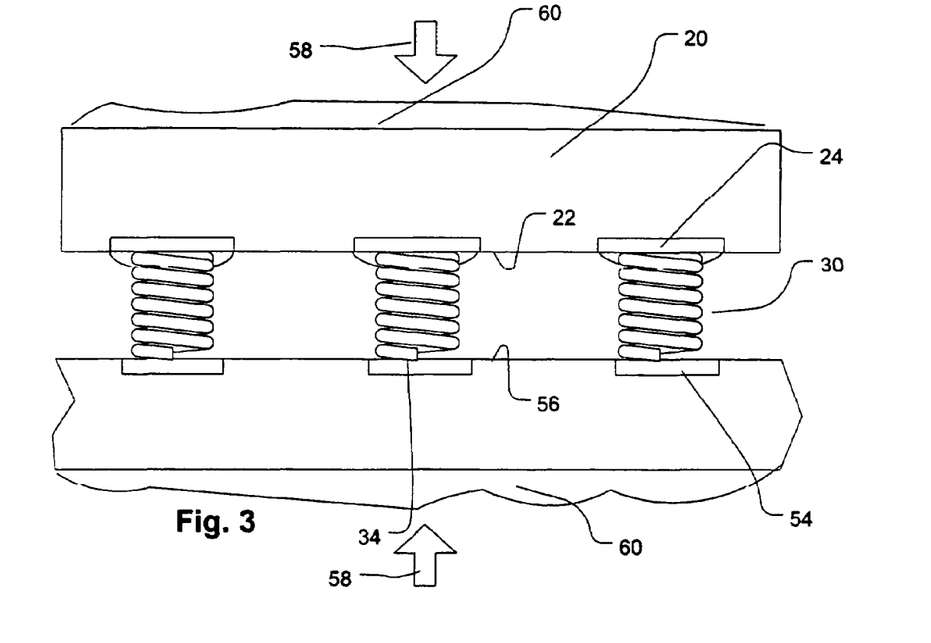
FIG. 3 is a view similar to FIG. 1, but depicting the device of FIG. 1 in an inverted position and in conjunction with a test fixture.

As the microelectronic element and test substrate move into engagement with one another, the distal ends 34 of the springs 30 engage the test contacts. Continued movement causes compression of springs 30 and applies increased loading to the abutting distal ends and test contacts. This action helps to assure that all of the distal ends are reliably engaged with the test contacts. Thus, if any of the distal ends are out of plane with one another, or if the test contacts are non-coplanar, or if the plane of the test contacts is tilted with respect to the plane of the springs, distal ends, such deviations will be accommodated by compression of the springs. Because the central regions 48 and distal regions 46 of the springs are substantially devoid of bonding material 44, these regions are free to deform and accommodate irregularities and non-planarities. Desirably, compression of the springs and application of force to urge the microelectronic element toward the test substrate continues until at least the central and distal regions of the springs reach a theoretical bottomed condition in which adjacent turns of each spring bear on one another and continues slightly beyond that bottomed condition. Even after the springs reach the bottomed condition, they can be compressed slightly by application of progressively greater forces. Although the present invention is not limited by any theory of operation, it is believed that this additional compressibility arises from buckling of the springs, compression of the individual turns, unwinding of the helical turns, or some combination of these phenomena. Regardless of the mechanism of operation, the force applied through each spring increases substantially after it reaches the bottomed condition, and the contact resistance between the distal ends of each spring and the associated test contact 54 declines substantially after reaching this condition. The distal ends of the springs may have microscopic burrs or other asperities. These asperities aid in making reliable electrical contact between the distal ends and the test contacts. Here again, the present invention is not limited by any theory of operation. However, it is believed that asperities on the springs help to create high contact pressures in small areas and held to break through contaminants on the engaged surfaces.

While the distal ends of the springs are engaged with the test contacts, the microelectronic element and the springs themselves are tested by operating the microelectronic element using signals and/or power applied through the test contacts and the abutting springs. The microelectronic element can be reliably tested and operated because the springs make reliable contact with the test contacts 54. Moreover, the test contacts 54 need not have any complex configuration or features to provide such reliable contact. Also, because the distal ends of the springs do not bear any bonding material, they will not deposit bonding material on the test contacts.

Figure 4:
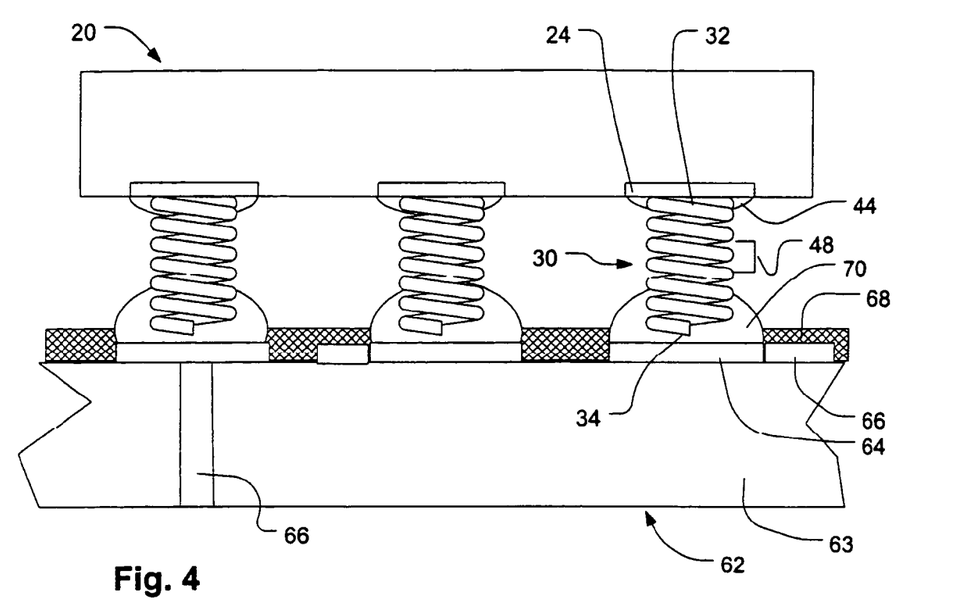
FIG. 4 is a further fragmentary, diagrammatic sectional view depicting an assembly incorporating the device of FIGS. 1-3 in conjunction with a circuit panel.

After the testing operation is complete, the microelectronic element is disconnected from the test substrate simply by releasing the pressure holding the elements together. Subsequently, springs 30 preferably revert back to their underformed state. The tested microelectronic element 20 is then mounted to a second substrate such as a circuit panel 62 (FIG. 4) by bonding the distal regions 48 of springs 30 to the contacts 64. As depicted in FIG. 4, circuit panel 62 includes a dielectric element 63 and conductors 66 in or on the dielectric element connected to the contacts 64 of the circuit panel. The circuit panel also preferably includes a solder mask layer 68 overlying the contact-bearing surface of the circuit panel, but having apertures aligned with contacts 64. Circuit panel 62 may be any conventional circuit panel such as an ordinary circuit board, a flexible circuit panel or the substrate of a larger module or chip package. In a further variant, substrate 62 may be a second semiconductor chip or wafer. The bonding operation used to connect the springs to the second substrate 62 may be a conventional surface mounting operation. In such an operation, masses of a second bonding material 70, typically a solder or a solder paste, are provided on the contacts 64 of the second circuit panel or, alternatively, on the distal regions 48 of the springs. Microelectronic element 20 is placed on the circuit panel so that the springs are aligned with the contacts 64 of the circuit panel, and the second bonding material is brought to a flowable condition or "reflowed," typically by heating, until the bonding material wets and encapsulates one or more turns of each spring adjacent to the distal end of the spring, whereupon the assembly is cooled to form a permanent bond. Solder mask layer 68 prevents spreading of the bonding material during this process. Where the bonding material is a solder, a flux may be applied in conjunction with the solder in the conventional manner. Alternatively, the heating operation may be performed under vacuum so that oxides present on the solder tend to degrade and dissipate without the use of flux. Other, conventional microelectronic elements (not shown) with conventional contacts or with spring contacts, as illustrated, may be mounted to the circuit panel in the same sequence of steps as, for example, using the same heating and cooling stages for reflow of the bonding material. Compatibility of the spring-bearing microelectronic element with normal surface mounting procedures offers a significant advantage; it is typically unnecessary to perform a separate, special sequence of steps to mount the spring-bearing element. Instead, the spring-bearing element can be handled when placed as just one more part in the normal surface mounting process sequence.

In the embodiment of FIG. 4, the amount of bonding material in each of the first bonding material masses 44 and second bonding material masses 70 is controlled so that the bonding material masses do not flow into the central region 48 of each spring. Stated another way, after the bonding operation used to bond the microelectronic element to the second substrate or circuit panel 62, the central regions 48 of the springs remain substantially devoid of bonding materials. Thus, the central regions of the springs remain very flexible. The distal end 34 of each spring can move readily relative to the proximal end 32 and, hence, relative to the associated contact 24 of the microelectronic element. During cooling after reflow, and during service, differential expansion and contraction of the microelectronic element 20 and circuit panel 62 may cause the circuit panel contacts 64 to move relative to the microelectronic element contacts 24. Such movement is readily accommodated by deformation of the springs. Thus, such relative movement applies little mechanical stress to the bonding materials. While the springs may be deformed to an appreciable degree, the stress within the springs desirably is near or below the fatigue limit of the springs, so that such stresses can be repeatedly applied and removed without breakage of the springs.

To aid in control of solder flows during the bonding operations, the central regions 46 of the springs may be coated with a material which is not wettable by the bonding materials employed. For example, where the bonding materials are solders, the central portions of the springs may be plated with a thin coating of nickel or deliberately oxidized, so as to provide non-wettable surfaces. In a further variant, the space between the microelectronic element 20 and the second or permanent mounting substrate 62 may be filled with an encapsulant after the reflow operation. The encapsulant may be a readily deformable encapsulant such as a gel or an elastomer. Alternatively, the encapsulant may be a material such as an epoxy having appreciable resistance to deformation and capable of binding to the exposed surfaces of the microelectronic element and circuit panel. Such epoxies are commonly used in "underfill" applications to reduce stress in solder joints. The underfill material tends to physically restrain relative motion of the contacts and, hence, reduces deformation of the springs. However, in a typical surface mounting application, such underfills are unnecessary.

In a variant of the procedures discussed above, the testing operation may include bonding the distal ends of the springs to the test contacts as, for example, by solder-bonding the distal ends to the test contacts in much the same manner as the distal ends are bonded to the contacts of the circuit panel in the procedure discussed above. After testing, the distal ends may be de-bonded from the test contacts and then bonded to contacts of a further circuit panel. To facilitate such debonding, the bonding materials used for temporary joining to the test contacts desirably have lower melting or degradation temperatures than the first bonding material which joins the proximal ends of the springs to the device. The temporary bonding material used to bond the distal ends of the springs to the test contacts may remain in place on the distal ends of the springs after debonding from the test contacts, so that these masses serve as part or all of the second bonding material which bonds the distal ends of the springs to the contacts of the circuit panel. In a further variant, the temporary bonding material may be removed from the springs. For example, if the temporary bonding material is a conductive polymeric material, the same may be removed by a solvent or by exposure to heat or radiation sufficient to degrade such material.

Figure 5:
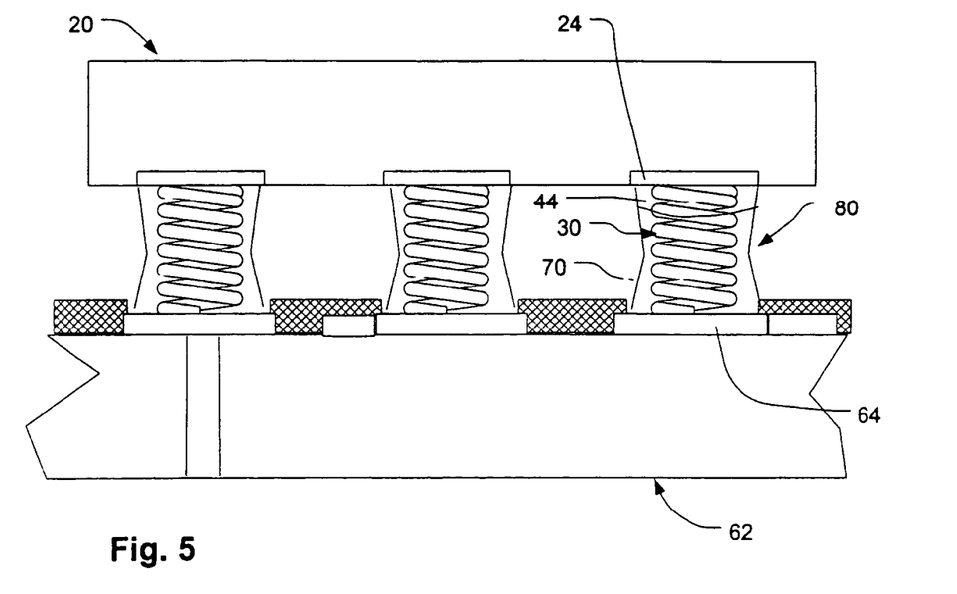
FIG. 5 is a view similar to FIG. 4, but depicting an assembly according to a further embodiment of the invention.

An assembly according to a further embodiment (FIG. 5) includes a spring-bearing microelectronic element 20 and circuit panel 62 as discussed above. Here, however, the second bonding materials 70 are allowed to flow and merge with one another to form continuous bonding material columns 80 extending between the contacts 24 of the microelectronic element and the contacts 64 of the circuit panel. This may be accomplished by applying the bonding materials in sufficient quantities to form such a continuous column and by holding the assembly under elevated temperature for a sufficient time to allow for flow of the bonding materials along the axes of the springs. The bonding materials 44 and 70, in their molten condition, desirably are at least partially soluble in one another and more preferably fully miscible with one another. Merely by way of example, both bonding materials may be solders of the same composition or including at least some of the same metals, so that the bonding materials effectively merge with one another during the reflow operation. Here again, the shapes of the solder columns 80 depicted in the drawings are idealize representations. Depending upon the quantity of bonding material present and the surface tension between the bonding material and the various components of the system, the solder columns may take the shape of thin coatings overlying the turns of the springs and may be hollow inside of the springs. In this arrangement, the springs 30 serve as metallic reinforcement for the solder columns. Thus, although relative movement of contacts 24 and 64 will require some flexing of the solder columns, the reinforcement provided by springs 30, as well as the elongated shapes of the columns, tend to minimize fatigue stress of the solder constituting the columns. Assemblies according to FIG. 5 may be made in substantially in the same manner as the assemblies of FIG. 4.

One method of manufacturing a microelectronic element with springs, such as the microelectronic element 20 discussed above, is partially depicted in FIG. 6. As shown therein, a wafer 100 incorporating numerous microelectronic elements 20 is assembled to a sheet 102 bearing springs 130 at predetermined locations corresponding to the locations of the contacts 124 on the front surface 122 of the wafer. Sheet 102 has the central portions 148 of the springs embedded in the material of the sheet so that the material of the sheet fills the gaps between the turns of the spring and fills the central passages within the individual springs in the central regions of the springs. Such a sheet with embedded springs may be formed, for example, by positioning the springs in an injection or compression mold and molding a polymeric material in contact with the springs, in a process commonly known as "insert molding." In a variant of such a process, the springs can be positioned in a mold or fixture and the material used to form sheet 102 may be molded or cast around the springs so as to form a precursor sheet having a thickness equal to or greater than the axial lengths of the springs. The material of the sheet may then be partially dissolved or etched away, so as to leave the springs projecting from opposite sides of the sheet.

Figure 6:
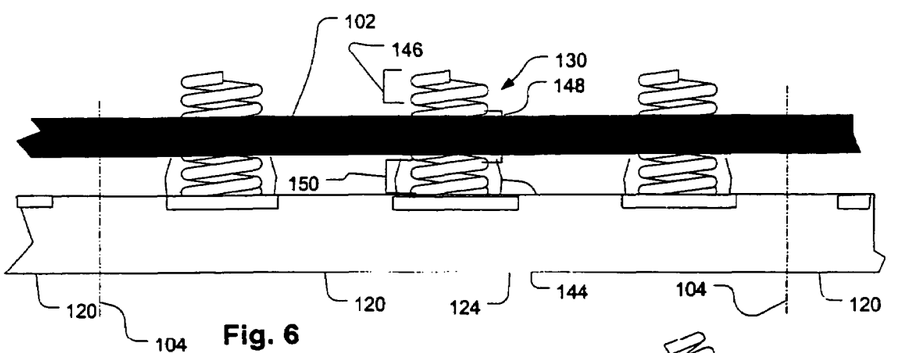
FIG. 6 is a fragmentary, diagrammatic sectional view depicting a device according to a further embodiment of the invention during a device fabrication process.

Solder or other bonding material 144 is applied on the proximal regions 150 of the springs or on contacts 124 and reflowed so as to embed the proximal regions of the springs in the bonding material. Desirably, this solder reflow operation is conducted in a vacuum environment, without the use of flux, although a conventional, atmospheric solder-bonding operation with flux also may be used. During the solder reflow operation, the material of sheet 102 blocks flow of solder along the lengths of the springs and prevents the solder from filling the passages in the springs in the central regions 148 and in the distal regions 146 of the springs.

After the springs have been bonded to the contacts, wafer 100 is severed along severance planes 104 so as to form one or more units, each including either a single microelectronic element 120 or a plurality of such elements. Before or after the severing step, sheet 102 may be removed as, for example, by exposing the wafer or the individual units to a solvent which dissolves the material of the sheet. If sheet 102 remains in place during the severing operation, the sheet may be severed along with the wafer.

In a further variant, sheet 102 is left in place. In this variant, the sheet forms a part of the completed microelectronic assembly. That is, the sheet is positioned between the second or permanent substrate and the microelectronic element in the completed assembly. In this variant, the sheet can limit flow of the second bonding material used to join the distal ends of the springs to the second substrate or circuit panel. Even though the central regions of the springs are filled by the material of the sheet, the distal regions remain entirely unfilled, and hence flexible, so that the microelectronic element can be tested substantially in the manner discussed above. Also, the material of the sheet may have sufficient flexibility so that it does not substantially impair deformation of the central regions 148 of the springs. In a further variant, sheet 102 is formed so that it does not fill the central passages of the springs and, hence, does not impede flow of bonding materials. To form such a sheet, springs 130 may be held in a bottomed, compressed state during formation of the sheet around the springs, so that the bottomed turns substantially prevent flow of the bonding material into the central passages of the springs. Alternatively, the mold may have pins arranged to fill the central bores of the springs during formation of the sheet. The pins are then withdrawn, leaving the central bores open. If the sheet is formed so that it does not fill the passages of the springs, the bonding materials can form continuous columns, as discussed above with reference to FIG. 5. In yet another arrangement, the springs may be filled with a fugitive filler which remains intact during formation of the sheet, but which dissipates at the temperatures used in bonding the springs to the microelectronic element.

Figure 7:
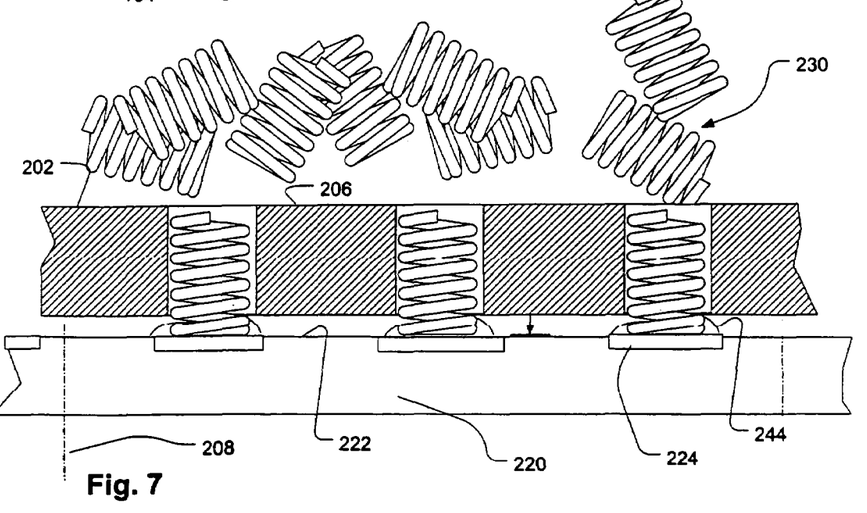
FIG. 7 is a diagrammatic view depicting a fixture used in a device fabrication method according to one embodiment of the invention.

In a device-forming method according to yet another embodiment of the invention, a wafer 220 (FIG. 7) is juxtaposed with a plate 202 having openings 204 slightly larger than the outside diameters of the springs. The openings 204 are disposed in a pattern corresponding to the pattern of contacts 224 on the front surface of wafer 220. A mass of springs 230 is provided on the top surface 206 of the plate, and the mass of springs 230 is agitated as, for example, by vibrating the plate and wafer; by mechanically agitating the mass using a brush or squeegee; or by other methods. The springs fall into openings 204. The top surface of plate 206 is positioned at a height H above the contacts 224 approximately equal to the free or undeformed length of an individual spring. Thus, once a spring has fallen into an individual hole 204, a second spring will not fall into the same hole. Here again, a bonding material 244 such as a solder is provided on the contacts 224 or on the proximal ends of the springs. Once the springs have been positioned, the bonding material can be reflowed or otherwise activated so as to bond the proximal ends of the springs to the contacts 224. After bonding the springs to the contacts, the wafer is severed as by cutting it along severance planes 208 so as to form individual units.

A method according to yet another embodiment of the invention (FIG. 8) uses springs 330 provided as series of springs in substantially end-to-end arrangements. Each series is constrained by a guide which may include a tube 302 surrounding the springs; a wire 304 disposed inside the central bores of the springs; or both. An escapement plate 308 having holes 306 extending through it is positioned over a wafer 300. The holes 306 in plate 308 are disposed in a pattern corresponding to the pattern of contacts 324 on the wafer. The plate is brought into alignment with the guides 302, 304 so as to align one hole with each guide. A single spring drops into each hole 306, whereupon the plate is moved out of alignment with the guides. The wafer may move along with the plate, so that each spring drops onto one contact 304 when it drops into a hole 306 in the plate. Alternatively, the wafer may be positioned so that the holes 306 are out of alignment with contacts 304 when they are in alignment with the guides 302, 304. In this arrangement, the springs drop into the holes and then move into alignment with the contacts when the plate moves out of alignment with the guides. In effect, the plate serves as an escapement mechanism dispensing one spring into each hole on each cycle of movement of the plate into and out of alignment with the guides.

Figure 8:
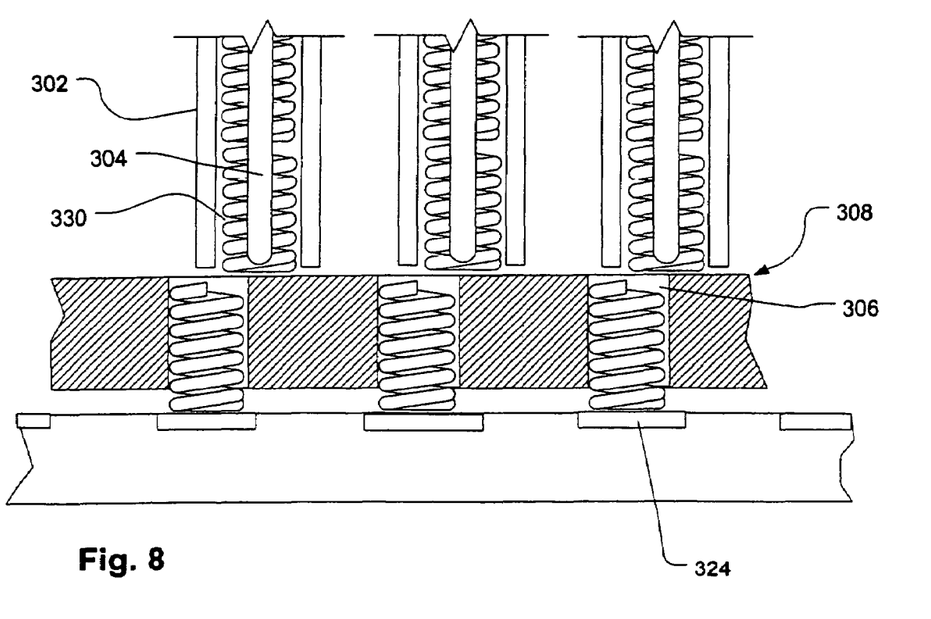
FIG. 8 is a diagrammatic view of a fixture according to a further embodiment of the invention.

In a further variant, plate 308 may be smaller than the wafer and may have fewer holes than the wafer. For example, plate 308 may have only one hole and may be arranged to dispense only one spring on each cycle, or else may have only a single row of holes, so that it dispenses only a single row of springs on each cycle of movement. In this arrangement, the wafer is moved relative to the plate and relative to the guides after each cycle, so that the springs dispensed on each cycle are brought into alignment with a different set of contacts on the wafer. This process is repeated until springs have been assembled to all of the contacts. In this arrangement as well, the wafer is severed after bonding springs to the various contacts.

The device-fabrication processes discussed above can be performed using individual units as, for example, individual chips, as opposed to a wafer. Also, the methods can be practiced using arrays of units assembled on a temporary substrate as, for example, a plurality of individual chips temporarily held on a support. Such an array can be processed in substantially the same manner as a wafer. After processing, the chips or units are detached from the support.

Figure 9:
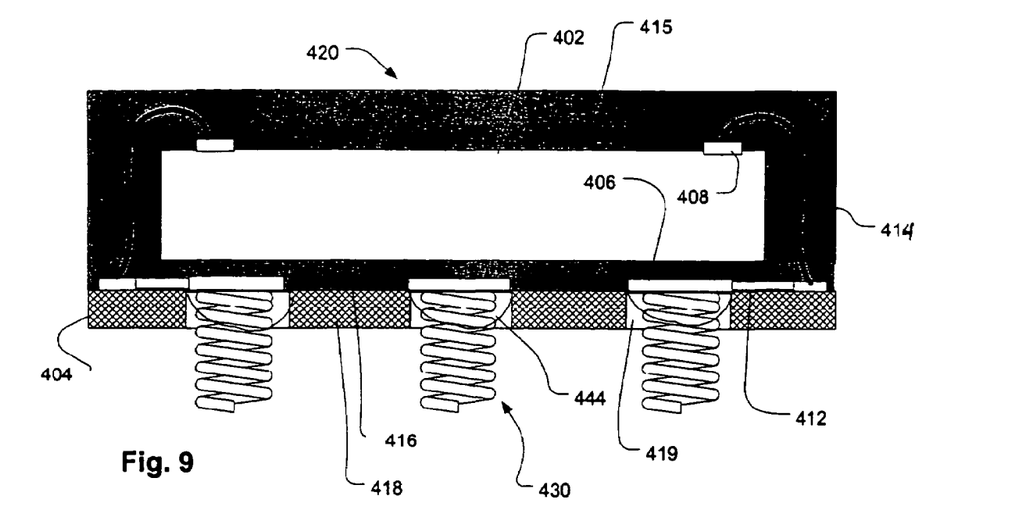
FIG. 9 is a diagrammatic sectional view depicting a device in accordance with a further embodiment of the invention.

In the embodiments discussed above, the microelectronic element is a bare or unpackaged chip. However, other microelectronic elements can be employed. For example, as seen in FIG. 9, a microelectronic element in the form of a packaged semiconductor chip 420 is employed. The packaged semiconductor chip includes a chip 402 and a package substrate 404 in the form of a dielectric layer having terminals 406 mounted to the dielectric layer. Terminals 406 are electrically connected to the contacts 408 of the chip itself by leads 410 which may include, for example, lead portions 412 on the dielectric layer, as well as wire bonds 414 connecting the contacts 408 of the chip to lead portions 402, so that contacts 408 of the chip are connected to terminals 406. Chip 402 and leads 410 are covered by an encapsulant or overmolding 415 which physically protects the chip and the leads. In the particular embodiment illustrated, chip 402 is disposed in a "face-up" orientation, with the contacts 408 of the chip facing upwardly away from dielectric layer or substrate 404 and away from terminals 406. The rear or downwardly facing surface of the chip is separated from the terminals 406 by a layer of die attach material 416. Terminals 406 in this embodiment are disposed on the inner or upwardly facing surface 417 of the dielectric layer, but are exposed at the outer or downwardly facing surface 418 of the dielectric layer through holes 419 in the dielectric layer. In this embodiment as well, springs 430 are mounted on the terminals 406 of the microelectronic element. Here again, a first bonding material 444 encompasses the proximal ends of the springs and secures the proximal ends of the springs to the contacts 406. However, this bonding material does not fill the distal regions of the springs, remote from contacts 406. The device of FIG. 9 can be handled and mounted in substantially the same way as the other devices discussed above.

The particular configuration of microelectronic element or packaged chip 420 is merely exemplary. A packaged chip of essentially any configuration can be used as the microelectronic element in a device according to the present invention. For example, some packaged chips are provided with the chip in a "face-down" orientation, with the contact-bearing surface of the chip itself facing towards the package substrate or dielectric element. Also, the packaged chip 420 of FIG. 9 has contacts or terminals 406 aligned with the chip. In other packaged chips, the dielectric element or package substrate 404 extends outwardly (in directions to the right and left as seen in FIG. 9), far beyond the edges of the chip, and some or all of the terminals forming the contacts of the microelectronic element are disposed in the outer regions of the package substrate, beyond the edges of the chip. The terminals of a packaged-chip microelectronic element as, for example, terminals 406 of the packaged chip in FIG. 9 optionally may be movable relative to the chip itself. However, such movability normally is not required, as springs 430 provide both testability and resistance to stresses caused by differential thermal expansion and contraction.

Numerous other microelectronic elements can be employed. For example, the microelectronic element may include a plurality of chips in a package or assembly. Certain chips are provided in a "stacked" arrangement, in which the chips are disposed one above the other. Such a stacked assembly can include contacts on a package substrate, or on the lower-most chip of the stack, for mounting the assembly to a circuit panel. These springs may be provided on these contacts on the same manner as discussed above. Certain stacked assemblies incorporate units, each including one or more chips and a substrate or dielectric element. These units commonly are connected to one another by electrically conductive elements such as solder balls. Stacked assemblies of this type are shown, for example, in certain embodiments of commonly assigned U.S. patent application Ser. No. 10/267,450, filed Oct. 9, 2002 (Application '450) and in a commonly assigned U.S. patent application entitled "Stacked Chips," filed on or about Jun. 3, 2003 as a continuation-in-part of said Application '450, the disclosures of which is incorporated by reference herein. A device according to a further embodiment of the invention includes, as the microelectronic element, a unit adapted for use in such a stack. The springs are mounted to terminals on the unit. In use, such a unit is electrically connected to the next-lower unit in the stack by the springs. Stated another way, in such an assemblage, a lower unit may serve as the substrate or circuit panel to which the upper unit is mounted.

Figure 10:
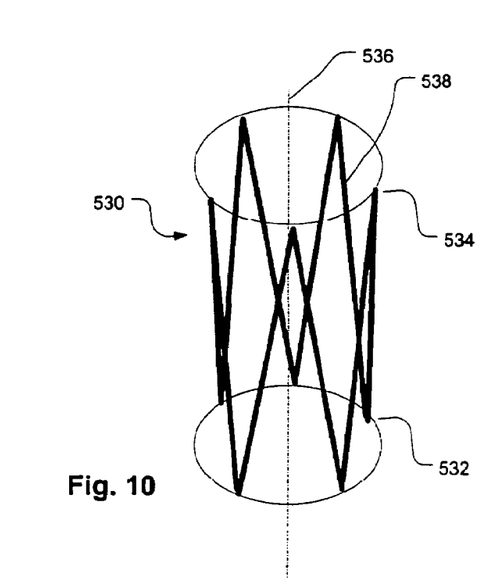
FIGS. 10 and 11 are diagrammatic perspective views depicting springs used in accordance with further embodiments of the invention.

Springs other than conventional coil springs may be employed. Merely by way of example, a spring 530 (FIG. 10) incorporates a wire or strip 538 formed in a zigzag pattern extending around a central axis 536, so as to define a plurality of bends or bights at a proximal end 532 and a further plurality of bends or bights at a distal end 534. The strip or wire bent in this fashion cooperatively encompasses an interior bore 542 surrounding the central axis.

Figure 11:
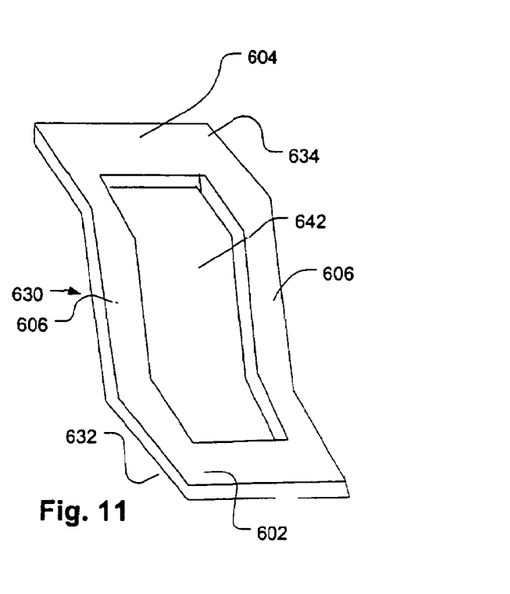

In still further variants, springs other than generally cylindrical springs can be employed. For example, spring 630 (FIG. 11) is in the form of a flexible metallic tab having a base element 602 at the proximal end 632, an end element 604 at the distal end 634 and pair of edge strips 606 extending between the base element 602 and end element 604. These strips cooperatively define a slot or passage 642 extending between the proximal and distal end of the spring. In use, such a spring can be mounted to a microelectronic element with a bonding material which does not entirely fill slot or passage 642.

Bonding materials other than solders may be employed. Merely by way of example, the springs and the terminals of the microelectronic element may be bonded to one another by eutectic or diffusion bonding. In such an arrangement, the bonding material may be incorporated in the metals of the spring and/or terminal. For example, where the terminals include gold, the spring may include a metal selected to form a low-melting eutectic with gold as, for example, a metal selected from the group consisting of tin, germanium and silicon. In such an arrangement, when the springs are engaged with the contacts and heated, the metal of the spring and the gold in the contact form a temporary liquid phase which changes in composition with time due to exchange of materials with the spring or the contact. The change in composition causes the molten material to re-solidify, even while it is held at the elevated temperature. Eutectic bonding materials typically provide liquid phases only in very small amounts at the interface between the engaged parts. Eutectic bonding materials, therefore, do not tend to fill the passages of the springs. In other arrangements, the bonding materials may be formed wholly or partially from non-metallic materials as, for example, a polymer composition incorporating electrically conductive particles dispersed in a polymeric binder.

In yet another variant, the first bonding material used to connect the springs with the terminals of the microelectronic element is a fugitive material which will decompose at the temperatures employed for applying the second bonding material to connect the distal ends of the springs to the circuit panel or other substrate. In such an arrangement, the fugitive first bonding material provides a temporary connection for the spring and allows testing of the assembly. When the second bonding material as, for example, a solder, is applied and reflowed, the first bonding material decomposes. The second bonding material desirably flows along each spring, from the distal end of the spring to the proximal end, so that the second bonding material can form a solder column encompassing the spring and can bind the proximal end of each spring to the associated contact of the microelectronic element.

It is not essential to provide springs on all of the terminals of the microelectronic element or to engage all of the springs with contacts on the substrate. For example, in the arrangement of FIG. 4, one or more of springs 30 may be omitted. Alternatively or additionally, one or more of the springs 30 may be juxtaposed with a part of circuit panel 62, which does not bear a contact 64.

Figure 12:
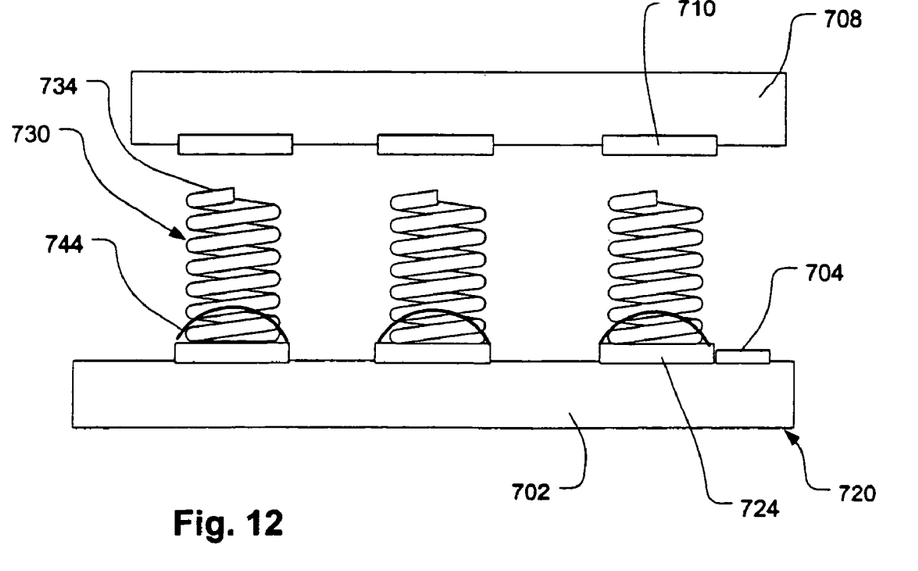
FIG. 12 is a diagrammatic elevational view depicting a device in accordance with another embodiment of the invention.

In yet another variant, the microelectronic element may be a circuit panel adapted to receive and engage other microelectronic elements. For example, as seen in FIG. 12, a circuit panel 720 incorporating a dielectric element 702 and leads or traces 704 on surfaces of the dielectric element or within the dielectric element is provided with springs 730. The springs are secured to a terminal such as a contact pad 724 of the circuit panel by a first bonding material 744. Such a panel can be engaged with a microelectronic element as, for example, a chip 708 having terminals or contacts 710. Such engagement may be a temporary engagement, without application of a bonding material for test purposes. Indeed, the panel 702 may be used as a test substrate for testing bare or unpackaged chips for other microelectronic elements. Alternatively or additionally, the terminals or contacts 710 of element 708 can be bonded to the distal ends 734 of the springs by application of a second bonding material. In a further variant (not shown), a double-sided circuit panel may be provided with springs projecting from both sides and connected to one another by vias or other electrical connections extending through the circuit panel. Such a double-sided spring-bearing circuit panel can be used as a temporary or permanent connector between other microelectronic elements.

In the embodiments discussed above, the springs are used to make electrical connections with contacts on another element. In a device according to yet another embodiment of the invention (FIG. 13), a microelectronic element 820 as, for example, a circuit panel or, preferably, a chip, incorporates an array of coil springs 830 having proximal ends 832 connected to contacts 824. Here again, the springs are provided in an array, with the central axes 836 of the springs projecting substantially parallel to one another. The microelectronic element incorporates conductive paths 802 extending to contacts 824. Each such conductive path may incorporate one or more conductors 804 in proximity to a potential reference element 806, such as a ground plane or a second conductor extending parallel to the first conductor 804. Signal paths 802 are constructed and arranged to have controlled impedances for signals at relatively high frequencies, and preferably about 10 GHz or more. The conductors of the signal paths are connected to contacts 824, so that signals propagating along these signal paths will be transferred to springs 830. Signal paths 802 are connected to a high frequency transmitting or receiving circuit 808.

Figure 13:
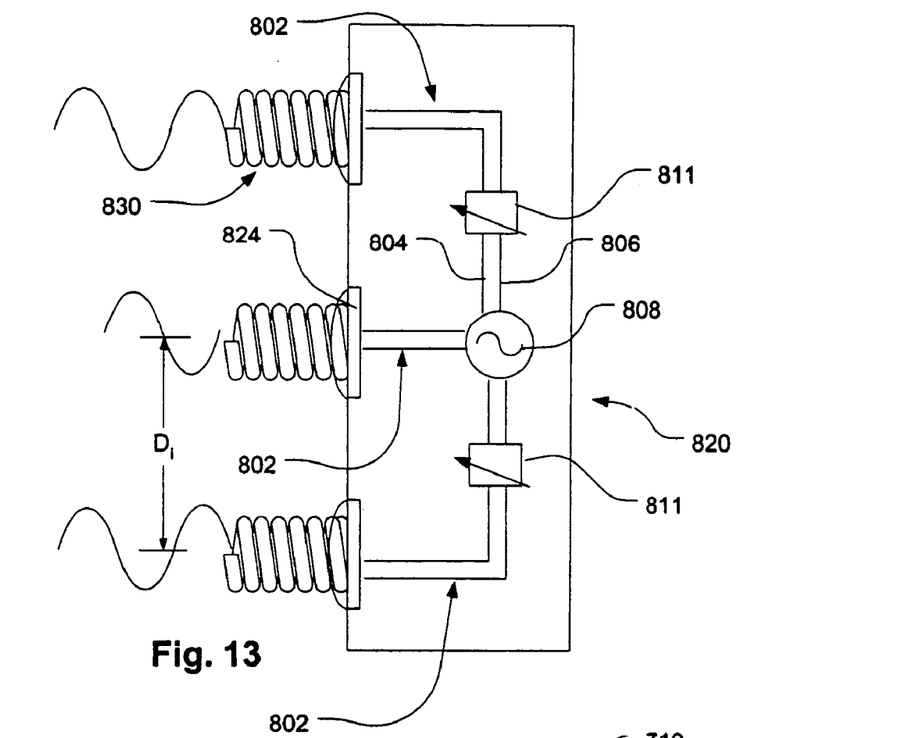
FIG. 13 is a partially block diagrammatic view depicting a device in accordance with yet another embodiment of the invention.

In this arrangement, the springs 830 serve as elements of a phased array. Preferably, the center-to-center spacing $D_I$ of the contacts 824 and springs 830 are on the order of the wavelength to be used in operation. For example, spacing $D_I$ may be between about 1 inch (25 mm) and 0.02 inches (500 microns), for use with operating frequencies of about 10 GHz to several hundred GHz. In a particularly preferred arrangement, the receiving or transmitting circuit 808 is at least partially incorporated in a unitary element such as a single microelectronic chip which also has the contacts 824 and springs 830 mounted thereon. Such an arrangement provides a self-contained miniaturized phased array device. Where the circuit 808 is a transmitting circuit, signals are propagated from circuit 808 along the various transmission paths 802 to the various contacts and springs. The springs 830 serve as individual radiating elements of the phased array. The phase of the signal propagated from each spring or radiating element will depend upon the phase delay associated with the transmission line 802 connected thereto. The signals propagated from the individual radiating elements merge with one another to form a transmitted beam. The direction and breadth of the transmitted beam will depend in part upon the phases of the signals from the individual radiating elements or springs, which, in turn, depend on the transmission delays of signal paths 802. These transmission delays may be preset when element 820 is fabricated as, for example, during formation of a semiconductor chip or during formation of the circuit panel. Alternatively, the delays in one or more of the signal paths may be controllable. At least one or more of these signal paths may include elements 811, which vary the signal propagation delays of the associated signal paths as, for example, variable capacitance elements, variable resistors or variable inductance elements, or more elaborate active electronic elements. In this manner, the device may provide a controllable, steerable transmitted beam. Where circuit 808 includes a receiving circuit, the operation of the device is exactly reciprocal to the transmitting arrangement. Thus, the springs 830 form a composite phased array receiving antenna, and the direction of maximum sensitivity of the receiving antenna depends upon the phase delays in the signal paths.

In yet another variant, the foregoing aspects of the invention may be combined with one another. Thus, a single element may incorporate some springs which serve as elements of a phased array and other springs which act to connect the element to another element of an assembly.

As these and other variations and combinations of the features discussed above can be utilized, the foregoing description of the preferred embodiments should be taken by way of illustration rather than by way of limitation of the invention as defined by the claims.

The invention claimed is:

1. A device comprising:
   (a) a microelectronic element having a front surface and terminals exposed at said front surface;
   (b) a plurality of springs, each having a proximal end, a distal end remote from said proximal end and a passage extending at least part of the way between said proximal end and said distal end, wherein at least some of said passages are completely enclosed by said spring associated therewith; and
   (c) a bonding material securing said proximal ends of said springs to said terminals, said distal ends of said springs projecting away from said terminals, said passages of at least some of said springs being at least partially unfilled by said bonding material.

2. The device as claimed in claim 1, wherein portions of the passages of said springs remote from said proximal ends of said springs are at least partially unfilled by said bonding material.

3. The device as claimed in claim 2, wherein said portions of said passages remote from said proximal ends of said springs unfilled by said bonding material include portions of said passages at said distal ends of said springs.

4. The device as claimed in claim 1, wherein said microelectronic element is an unpackaged chip.

5. The device as claimed in claim 1, wherein said microelectronic element includes an assemblage including a plurality of chips.

6. The device as claimed in claim 1, wherein said distal ends of said springs lie substantially in a common plane.

7. A device including:
   (a) a first unpackaged chip having a front surface and contacts exposed at said front surface;
   (b) a plurality of springs, each said spring having a proximal end and a distal end, a passage extending between said proximal end and said distal end that is completely surrounded by said spring associated therewith, said proximal ends of said springs being disposed adjacent said contacts, said springs projecting away from said chip so that said distal ends of said springs are remote from said front surface; and
   (c) a bonding material having a composition different from said springs and contacts, said bonding material securing said proximal ends of said springs to said contacts, said distal ends of said springs being devoid of said bonding material.

8. A device as claimed in claim 7, wherein said springs include curved wires.

9. A device as claimed in claim 7, wherein said bonding material includes a solder.

10. A miniaturized phase array device comprising:
    (a) a base element having a front surface and having contacts exposed at said front surface, said contacts being disposed in an array such that adjacent contacts define center-to-center distances of less than about 2.5 mm;
    (b) a plurality of generally helical conductive coils each having a proximal end, a distal end, an axis extending between said ends and a plurality of turns extending around said axis, said proximal ends of said coils being bonded to said contacts so that said coils project away from said contacts.

11. A device as claimed in claim 10, wherein said base element is a unitary element having signal paths extending to said contacts.

12. A device as claimed in claim 11, wherein said signal paths have controlled impedances for signals at about 10 GHz or more.

13. A device as claimed in claim 12, wherein said unitary element is a chip or wafer.

14. A device as claimed in claim 13, wherein said unitary element is a dielectric element.

15. A device as claimed in claim 12, further comprising one or more circuits connected to said coils through said conductive paths and contacts, said power circuits being operative to transmit or receive signals.

16. A device as claimed in claim 12, wherein said signal paths have signal propagation delays, the signal propagation delays of signal paths connecting different ones of said contacts to said one or more circuits differing from one another.

17. A device as claimed in claim 16, wherein said unitary element further includes one or more variable elements connected in one or more of said signal paths for varying the signal propagation delays of one or more of said signal paths.

18. A device as claimed in claim 17, wherein said one or more circuits include active elements disposed within said unitary element.

19. A device as claimed in claim 10, wherein said coils are solder-bonded to said contacts.

20. A device as claimed in claim 10, wherein said axes of said coils are substantially parallel to one another.

21. A device comprising:
(a) a microelectronic element having a front surface and terminals exposed at said front surface;
(b) a plurality of springs, each having a proximal end, a distal end remote from said proximal end and a passage extending at least part of the way between said proximal end and said distal end; and
(c) a bonding material securing said proximal ends of said springs to said terminals, said distal ends of said springs projecting away from said terminals, said passages of at least some of said springs being at least partially unfilled by said bonding material, wherein portions of the passages of said springs remote from said proximal ends of said springs are at least partially unfilled by bonding material, and wherein said bonding material at least partially fills portions of said passages of said springs adjacent said proximal ends thereof.

22. A device comprising:
(a) a microelectronic element having a front surface and terminals exposed at said front surface;
(b) a plurality of generally helical coil spring springs, each having a proximal end, a distal end remote from said proximal end, a passage extending at least part of the way between said proximal end and said distal end, an axis extending between said proximal and distal ends and a plurality of turns extending around said axis; and
(c) a bonding material securing said proximal ends of said springs to said terminals, said distal ends of said springs projecting away from said terminals, said passages of at least some of said springs being at least partially unfilled by said bonding material.

23. The device as claimed in claim 22, wherein at least some of said turns of each said spring are spaced apart from one another so that at least some adjacent turns define gaps therebetween, at least some of said gaps of each said spring being devoid of said bonding material.

24. The device as claimed in claim 22, wherein each said coil spring has a major diameter less than about 50 μm.

25. The device as claimed in claim 22, wherein each said coil spring has a length less than 2000 μm.

26. A device comprising:
(a) a microelectronic element having a front surface and terminals exposed at said front surface, said microelectronic element including an assemblage including a plurality of chips, said chips being disposed in a stacked arrangement so that one of said plurality of chips is disposed above another one of said plurality of chips;
(b) a plurality of springs, each having a proximal end, a distal end remote from said proximal end and a passage extending at least part of the way between said proximal end and said distal end; and
(c) a bonding material securing said proximal ends of said springs to said terminals, said distal ends of said springs projecting away from said terminals, said passages of at least some of said springs being at least partially unfilled by said bonding material.

27. A device comprising:
(a) a microelectronic element having a front surface and terminals exposed at said front surface, said microelectronic element including a circuit panel incorporating a dielectric carrying said terminals and conductors secured to said dielectric element, said conductors being connected to at least some of said terminals;
(b) a plurality of springs, each having a proximal end, a distal end remote from said proximal end and a passage extending at least part of the way between said proximal end and said distal end; and
(c) a bonding material securing said proximal ends of said springs to said terminals, said distal ends of said springs projecting away from said terminals, said passages of at least some of said springs being at least partially unfilled by said bonding material.

28. A device including:
(a) a first unpackaged chip having a front surface and contacts exposed at said front surface;
(b) a plurality of coil springs, each said coil spring having a proximal end and a distal end, said proximal ends of said coil springs being disposed adjacent said contacts, said coil springs projecting away from said chip so that said distal ends of said coil springs are remote from said front surface; and
(c) a bonding material having a composition different from said springs and contacts, said bonding material securing said proximal ends of said springs to said contacts, said distal ends of said springs being devoid of said bonding material.

29. A device as claimed in claim 28, wherein said springs have major diameters less than about 500 μm.

30. A device including:
(a) a first unpackaged chip having a front surface and contacts exposed at said front surface and a plurality of additional chips, said additional chips and said first chip being portions of a unitary wafer;
(b) a plurality of springs, each said spring having a proximal end and a distal end, said proximal ends of said springs being disposed adjacent said contacts, said springs projecting away from said chip so that said distal ends of said springs are remote from said front surface; and
(c) a bonding material having a composition different from said springs and contacts, said bonding material securing said proximal ends of said springs to said contacts, said distal ends of said springs being devoid of said bonding material.

* * * * *

UNITED STATES PATENT AND TRADEMARK OFFICE
CERTIFICATE OF CORRECTION

PATENT NO. : 7,304,376 B2  Page 1 of 1
APPLICATION NO. : 10/901407
DATED : December 4, 2007
INVENTOR(S) : Belgacem Haba et al.

It is certified that error appears in the above-identified patent and that said Letters Patent is hereby corrected as shown below:

On the face of the patent:
    (73) Assignee: "Tessers, Inc." should read --Tessera, Inc.--.

In the Specification:
    Column 3, line 3 after "includes" delete "and".
    Column 17, line 38 after "coil" delete "spring".
    Column 17, line 55 "50" should read --500--.

Signed and Sealed this

Sixth Day of January, 2009

JON W. DUDAS
*Director of the United States Patent and Trademark Office*